US010003019B2

(12) United States Patent
Xu et al.

(10) Patent No.: US 10,003,019 B2
(45) Date of Patent: Jun. 19, 2018

(54) SEMICONDUCTOR DEVICE, RELATED MANUFACTURING METHOD, AND RELATED ELECTRONIC DEVICE

(71) Applicant: Semiconductor Manufacturing International (Shanghai) Corporation, Shanghai (CN)

(72) Inventors: Jia Xu, Shanghai (CN); Jiadong Ren, Shanghai (CN)

(73) Assignee: SEMICONDUCTOR MANUFACTURING INTERNATIONAL (SHANGHAI) CORPORATION (CN)

(*) Notice: Subject to any disclaimer, the term of this patent is extended or adjusted under 35 U.S.C. 154(b) by 0 days. days.

(21) Appl. No.: 15/344,226

(22) Filed: Nov. 4, 2016

(65) Prior Publication Data

US 2017/0077397 A1  Mar. 16, 2017

Related U.S. Application Data

(62) Division of application No. 14/712,735, filed on May 14, 2015, now Pat. No. 9,502,645.

(30) Foreign Application Priority Data

May 22, 2014 (CN) .......................... 2014 1 0219056

(51) Int. Cl.
*H01L 45/00* (2006.01)

(52) U.S. Cl.
CPC ............ *H01L 45/06* (2013.01); *H01L 45/122* (2013.01); *H01L 45/1233* (2013.01);
(Continued)

(58) Field of Classification Search
CPC .............. H01L 45/122; H01L 45/1675; H01L 45/1233; H01L 45/06; H01L 45/144; H01L 45/1625; H01L 45/1608; H01L 45/1246
(Continued)

(56) References Cited

U.S. PATENT DOCUMENTS

2005/0018593 A1* 1/2005 Doi ...................... H01L 45/1625
369/275.2
2005/0127349 A1* 6/2005 Horak ...................... H01L 45/06
257/3
(Continued)

FOREIGN PATENT DOCUMENTS

WO WO2014040359 * 3/2014 ............. H01L 45/16

*Primary Examiner* — Walter H Swanson
(74) *Attorney, Agent, or Firm* — Innovation Counsel LLP

(57) ABSTRACT

A method for manufacturing a semiconductor device may include the following steps: preparing a substrate; preparing a first insulating layer on the substrate; preparing an electrode in the first insulating layer; preparing a second insulating layer on the first insulating layer; removing (e.g., using a dry etching process or a wet etching process) a portion of the second insulating layer to form a hole that at least partially exposes the electrode; providing a phase change material layer that may cover the electrode; and removing (e.g., using a sputtering process such as an argon sputtering process), a portion of the phase change material layer positioned inside the hole to form a phase change member that may expose a first portion of (a top side of) the electrode and may directly contact a second portion of (the top side of) the electrode.

8 Claims, 6 Drawing Sheets

(52) U.S. Cl.
CPC ........ *H01L 45/1246* (2013.01); *H01L 45/144* (2013.01); *H01L 45/1608* (2013.01); *H01L 45/1625* (2013.01); *H01L 45/1675* (2013.01)

(58) Field of Classification Search
USPC ........................................................ 438/382
See application file for complete search history.

(56) References Cited

U.S. PATENT DOCUMENTS

| | | | |
|---|---|---|---|
| 2008/0268568 A1* | 10/2008 | Liu ........................ | H01L 45/06 438/102 |
| 2009/0020741 A1* | 1/2009 | Park ........................ | H01L 45/06 257/3 |
| 2009/0280599 A1 | 11/2009 | Im et al. | |
| 2010/0264396 A1* | 10/2010 | Lung ................. | G11C 13/0004 257/3 |
| 2010/0283029 A1* | 11/2010 | Dennison ................ | H01L 45/06 257/3 |
| 2011/0012083 A1 | 6/2011 | Lee et al. | |
| 2011/0198555 A1* | 8/2011 | Kikuchi .................. | H01L 45/06 257/3 |
| 2014/0291597 A1* | 10/2014 | Song ........................ | H01L 45/06 257/2 |

* cited by examiner

SEMICONDUCTOR DEVICE, RELATED MANUFACTURING METHOD, AND RELATED ELECTRONIC DEVICE

CROSS-REFERENCE TO RELATED APPLICATION

This application is a divisional of U.S. application Ser. No. 14/712,735 filed on 14 May 2015, which application claims priority to and the benefit of Chinese Patent Application No. 201410219056.6, filed on 22 May 2014, the disclosures of which are incorporated herein by their reference.

BACKGROUND OF THE INVENTION

The present invention is related to a semiconductor device, a method for manufacturing the semiconductor device, and an electronic device that includes the semiconductor device.

A semiconductor device may include a phase change member, which may be formed of a phase change material, for performing one or more particular functions. For example, a phase change memory device may include a phase change member for performing functions related to data storage.

In a semiconductor device that includes a phase change member, the contact area between the phase change member and a corresponding electrode may be substantially large. The structure may cause the drive current for the semiconductor device to be a substantially large, such that the semiconductor device may undesirably consume excessive power.

Specifications and/or limitations of the front-end-of-line (FEOL) member and/or the manufacturing equipment associated with the phase change member and/or the corresponding electrode may prevent effective reduction of the critical dimensions of the phase change member and the corresponding electrode, such that reduction of the contact area may be difficult. Therefore, reduction of the drive current and the power consumption based on well-known structures and processes may be difficult.

SUMMARY

An embodiment of the present invention may be related to a method for manufacturing a semiconductor device. The method may include the following steps: preparing a substrate; preparing (e.g., forming) a first insulating layer on the substrate; preparing (e.g., forming) a first electrode in the first insulating layer; preparing a second insulating layer on the first insulating layer; removing (e.g., using a dry etching process or a wet etching process) a portion of the second insulating layer to form a hole that at least partially exposes the first electrode; providing a phase change material layer that may cover the first electrode; and removing (e.g., using a sputtering process such as an argon sputtering process), a portion of the phase change material layer positioned inside the hole to form a phase change member that may expose a first portion of (a top side of) the first electrode and may directly contact a second portion of (the top side of) the first electrode.

The substrate may be a front-end-of-line (FEOL) member that may include one or more of a semiconductor substrate, a metal layer, an electronic component, an interconnect structure, etc.

For forming the first electrode, the method may include the following steps: forming, e.g., through etching, a hole that may extend through the first insulating layer; providing a conductive material at least in the hole; and performing a polishing process, e.g., a chemical-mechanical polishing (CMP) process, to remove excess conductive material, such that the first electrode may be formed.

The method may include the following steps: providing, e.g., depositing, an adhesive material at least in the hole to form an adhesive layer before providing the conductive material in the hole; and, before removing the excess conductive material, performing a polishing process, e.g., a CMP process, to remove excess adhesive material that is higher than the first insulating layer. After the first electrode has been formed, the adhesive layer may be positioned between the first electrode and at least one of the first insulating layer and the substrate. The adhesive layer may enhance the structural stability and robustness of the semiconductor device.

The phase change member may have a hollow structure (and/or hallow shape). For example, the phase change member may have a hollow (or through-hole) that may extend from the first electrode to a top side of the phase change member.

The phase change member may be ring-shaped in a top view of the phase change member. The first portion of the first electrode may be surrounded by the second portion of the first electrode.

The method may include removing a portion of the phase change material layer covering the second insulating layer when removing the portion of the phase change material layer positioned inside the hole. A portion of the phase change material layer that attaches to an inner sidewall of the hole may remain unremoved and may form the phase change member.

A thickness of the phase change member in a direction parallel to the substrate may be in a range of 10 nm to 30 nm. The thickness of the phase change member may be a difference between an outer radius of the phase change member and an inner radius of the phase change member.

An outer diameter of the phase change member may be in a range of 30 nm to 100 nm. An inner diameter of the phase change member may be in a range of 20 nm to 90 nm.

The method may include the following steps: providing a first dielectric material in the hole and/or in the hollow; and using the first dielectric material to form a first dielectric member. The first dielectric member may be positioned between two portions of the phase change member and/or may be surrounded by the phase change member.

The method may include the following steps: providing a second dielectric material in the hole and/or in the hollow; and using the second dielectric material to form a second dielectric member. The second dielectric material may be different from the first dielectric material. The second dielectric member may be positioned between two portions of the first dielectric member and/or may be surrounded by the first dielectric member.

One or more polishing processes, e.g., one or more CMP processes, may be performed to remove one or more of a portion of the second dielectric material, a portion of the first dielectric material, and a portion of the second insulating layer that extend beyond the phase change member.

A first polishing process, e.g., a first CMP process, may be performed to remove a portion of the second dielectric material that is positioned outside the hole and/or overlaps the second insulating layer, the first dielectric material, and/or the phase change member in a direction perpendicular to the substrate, for forming the second dielectric member. The first polishing process and/or a second polishing process may be performed to remove a portion of the first dielectric material that is positioned outside the hole and/or overlaps the second insulating layer and/or the phase change member in a direction perpendicular to the substrate, for forming the first dielectric member. The first polishing process, the second polishing process, and/or a third polishing process may be performed to remove a portion of the second insulating layer that is higher than the phase change member, for optimizing the thickness of the second insulating layer.

As a result, the top surfaces of the second insulating layer, the phase change member, the first dielectric member, and the second dielectric member may be substantially positioned in a same horizontal plane.

The method may include forming a second electrode on the phase change member. The second electrode may directly contact the phase change material and may directly contact one or more of the first dielectric member, the second dielectric member, and the second insulating layer. Each of the phase change material, the first dielectric member, and the second dielectric member may be positioned between the first electrode and the second electrode.

An embodiment of the semiconductor device may include the following elements: a first electrode; and a phase change member formed of a phase change material and partially overlapping the first electrode. A first portion of a side of the first electrode may directly contact a first portion of the phase change member. A second portion of the side of the first electrode may directly contact a second portion of the phase change member. A third portion of the side of the first electrode may be positioned between the first portion of the side of the first electrode and the second portion of the side of the first electrode and may not directly contact the phase change member.

The phase change member may have a hollow structure (and/or hollow shape).

The phase change member may be ring-shaped in a top view of the phase change member. The third portion of the side of the first electrode may be surrounded by the phase change member in a top view that shows the phase change member and the third portion of the side of the first electrode.

The semiconductor device may include a substrate, which may be a FEOL member that may include one or more of a semiconductor substrate, a metal layer, an electronic component, an interconnect structure, etc. The first electrode may be positioned between the substrate and the phase change member.

A thickness of each of the first portion of the phase change member and the second portion of the phase change member may be in a range of 10 nm to 30 nm.

A width (e.g., an outer diameter) of the phase change member in a direction parallel to the substrate may be in a range of 30 nm to 100 nm. A distance between the first portion of the phase change member and the second portion of the phase change member (e.g., an inner diameter) may be in a range of 20 nm to 90 nm.

The semiconductor device may include a first dielectric member, which may be formed of a first dielectric material. The first dielectric member may directly contact the third portion of the side of the first electrode. The first dielectric member may be positioned between the first portion of the phase change member and the second portion of the phase change member. The first dielectric member may be surrounded by the phase change member.

The semiconductor device may include a second dielectric member, which may be formed of a second dielectric material different from the first dielectric material. The second dielectric member may directly contact the third portion of the side of the first electrode. The second dielectric member may be positioned between two portions of the first dielectric member and/or may be surrounded by the first dielectric member.

The semiconductor device may include a second electrode. At least one of the first dielectric member and the second dielectric member may be positioned between the first electrode and the second electrode.

An embodiment of the invention may be related to an electronic device may include one or more features of the aforementioned semiconductor device and/or may include a semiconductor device manufactured using one or more steps of the aforementioned method.

According to embodiments of the invention, a semiconductor device may be manufactured to include a hollow phase change member, such that the contact area between the phase change member and a corresponding electrode may be minimized, while specifications and limitations related to the associated front-end-of-line member and the associated manufacturing equipment may also be satisfied. Therefore, the drive current for the semiconductor device (and a related electronic device) may be minimized. Advantageously, power consumption of the semiconductor device (and the related electronic device) may be minimized.

The sputtering process used for forming the phase change member may also provide advantages related to process compatibility.

The above summary is related to one or more of many embodiments of the invention disclosed herein and is not intended to limit the scope of the invention.

DETAILED DESCRIPTION

Figure 1A:
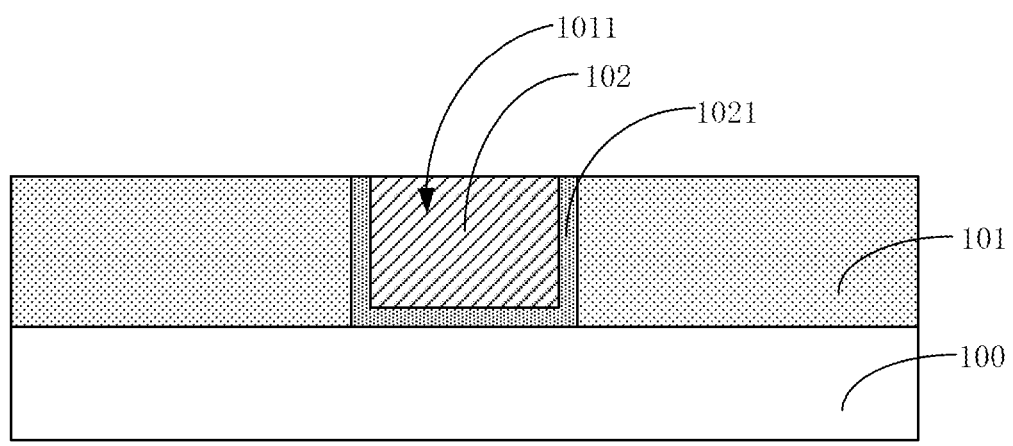
FIG. 1A, FIG. 1B, FIG. 1C, FIG. 1D, FIG. 1E, FIG. 1F, and FIG. 1G show schematic cross-sectional views that illustrate structures formed in a method for manufacturing a semiconductor device in accordance with one or more embodiments of the present invention.

Example embodiments of the present invention are described with reference to the accompanying drawings. As those skilled in the art would realize, the described embodiments may be modified in various different ways, all without departing from the spirit or scope of the present invention. Embodiments of the present invention may be practiced without some or all of these specific details. Well known process steps and/or structures may not have been described in detail in order to not unnecessarily obscure the present invention.

The drawings and description are illustrative and not restrictive. Like reference numerals may designate like (e.g., analogous or identical) elements in the specification. Repetition of description may be avoided.

The relative sizes and thicknesses of elements shown in the drawings are for facilitate description and understanding, without limiting the present invention. In the drawings, the thicknesses of some layers, films, panels, regions, etc., may be exaggerated for clarity.

Illustrations of example embodiments in the figures may represent idealized illustrations. Variations from the shapes illustrated in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

Although the terms "first", "second", etc. may be used herein to describe various elements, these elements, should not be limited by these terms. These terms may be used to distinguish one element from another element. Thus, a first element discussed below may be termed a second element without departing from the teachings of the present invention. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may also be present between the first element and the second element.

Spatially relative terms, such as "beneath", "below", "lower", "above", "upper", and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments and is not intended to limit the invention. As used herein, the singular forms, "a", "an", and "the" may indicate plural forms as well, unless the context clearly indicates otherwise. The terms "includes" and/or "including", when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one of ordinary skill in the art related to this invention. Terms, such as those defined in commonly used dictionaries, should be interpreted as having meanings that are consistent with their meanings in the context of the relevant art and should not be interpreted in an idealized or overly formal sense unless expressly so defined herein.

The term "connect" may mean "electrically connect". The term "insulate" may mean "electrically insulate". The term "conductive" may mean "electrically conductive"

Unless explicitly described to the contrary, the word "comprise" and variations such as "comprises", "comprising", "include", or "including" may imply the inclusion of stated elements but not the exclusion of other elements.

Various embodiments, including methods and techniques, are described in this disclosure. Embodiments of the invention may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out operations pertaining to embodiments of the invention. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the invention.

Figure 2:
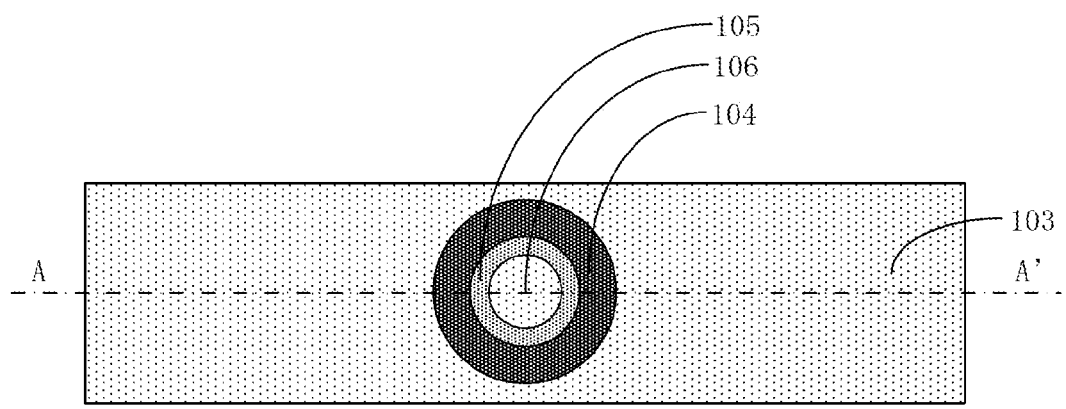
FIG. 2 shows a schematic top view that illustrates elements and structures of a semiconductor device in accordance with one or more embodiments of the present invention.
Figure 3:
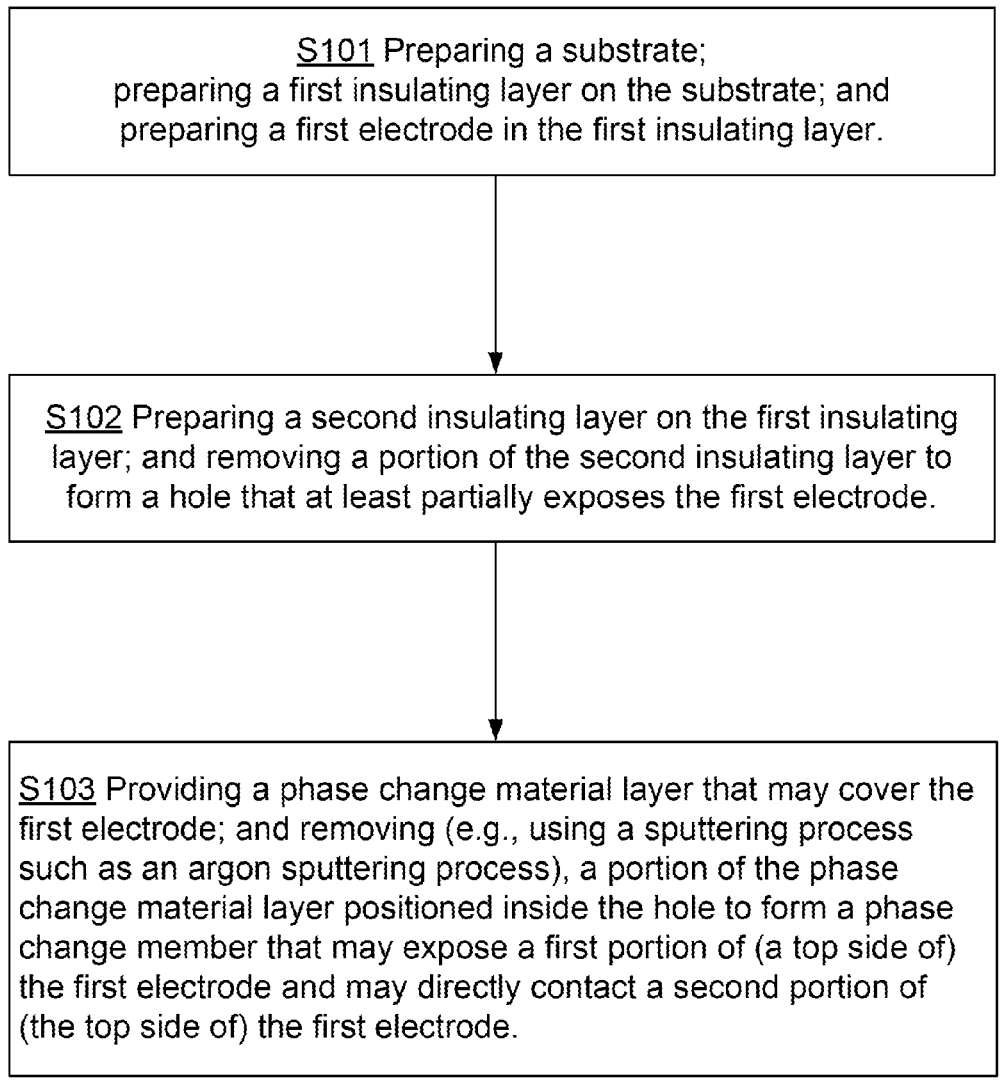
FIG. 3 shows a flowchart that illustrates a method for manufacturing a semiconductor device in accordance with one or more embodiments of the present invention.

FIG. 1A, FIG. 1B, FIG. 1C, FIG. 1D, FIG. 1E, FIG. 1F, and FIG. 1G show schematic cross-sectional views that illustrate structures formed in a method for manufacturing a semiconductor device in accordance with one or more embodiments of the present invention. FIG. 2 shows a schematic top view that illustrates elements and structures of a semiconductor device, e.g., the structure illustrated in FIG. 1F, in accordance with one or more embodiments of the present invention. FIG. 3 shows a flowchart that illustrates a method for manufacturing a semiconductor device, for example, a semiconductor device with structures illustrated in one or more of the aforementioned figures, in accordance with one or more embodiments of the present invention.

Referring to FIG. 3, the method may include a step S101, a step S102, and a step S103

Referring to FIG. 3 and FIG. 1A, the step S101 may include the following sub-steps: preparing a substrate 100; preparing a first insulating layer 101 on the substrate 100; and preparing a first electrode 102 in the first insulating layer 101.

The substrate 100 may be a front-end-of-line (FEOL) member that may include one or more of a semiconductor substrate, a metal layer, an electronic component, an interconnect structure, etc. The first insulating layer 101 may be formed of silicon oxide, silicon nitride, and/or one or more other suitable materials. The first electrode 102 may be formed of tungsten and/or one or more other suitable materials.

For forming the first electrode 102, the method may include the following steps: forming, e.g., through etching, a hole 1011 that may extend through the first insulating layer 101; providing a conductive material at least in the hole 1011; and performing a polishing process, e.g., a chemical-mechanical polishing (CMP) process, to remove excess conductive material, such that the first electrode 102 may be formed. The conductive material (e.g., tungsten) may be provided using one or more of a deposition process, a sputtering process, an evaporation process, etc.

The method may include the following steps: providing, e.g., depositing, an adhesive material (or glue material) at least in the hole 1011 to form an adhesive layer 1021 (or glue layer 1021) before providing the conductive material in the hole 1011; and, before removing the excess conductive material, performing a polishing process, e.g., a CMP process, to remove excess adhesive material that is higher than the first insulating layer 101. After the first electrode 102 has been formed, the adhesive layer 1021 may be positioned between the first electrode 102 and at least one of the first insulating layer 101 and the substrate 100. The adhesive layer 1021 may enhance the structural stability and robustness of the semiconductor device.

The first electrode 102 may be electrically connected (e.g., through the adhesive layer 1021 or one or more interconnects in the adhesive layer 1021) to one or more conductive elements and/or electronic components in the substrate 100.

Figure 1B:
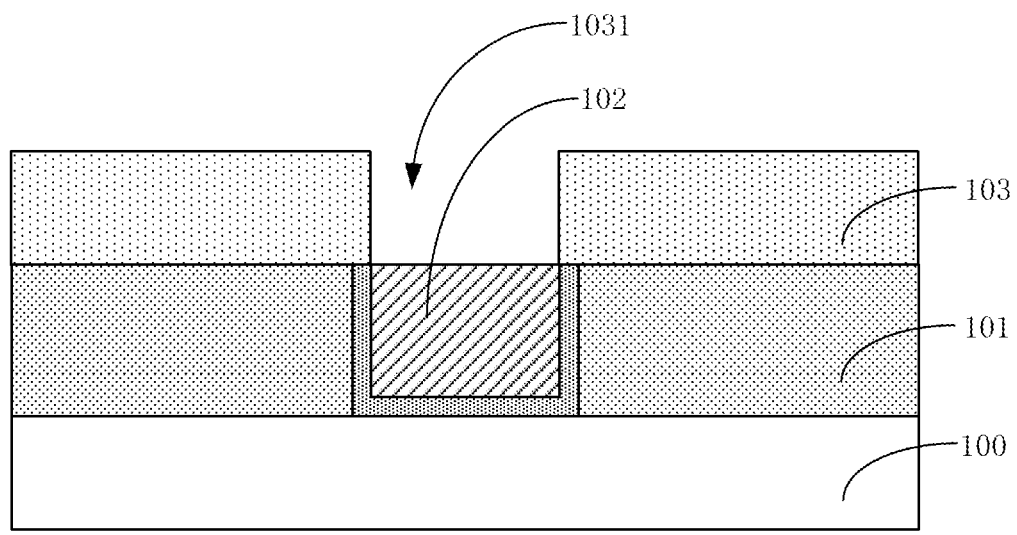

Referring to FIG. 3 and FIG. 1B, the step S102 may include the following sub-steps: preparing a second insulating layer 103 on the first insulating layer 101; and removing (e.g., using a dry etching process and/or a wet etching process) a portion of the second insulating layer 103 to form a hole 1031 that at least partially exposes the first electrode 102. The second insulating layer 102 may be formed of silicon oxide, silicon nitride, and/or one or more other suitable materials. The hole 1031 may be substantially aligned with the first electrode 102 in a direction perpendicular to (the bottom surface of) the substrate 100. A dimension (e.g., a diameter) of the hole 1031 may be greater than, equal to, or less than a corresponding dimension (e.g., a diameter) of the first electrode 102

Figure 1C:
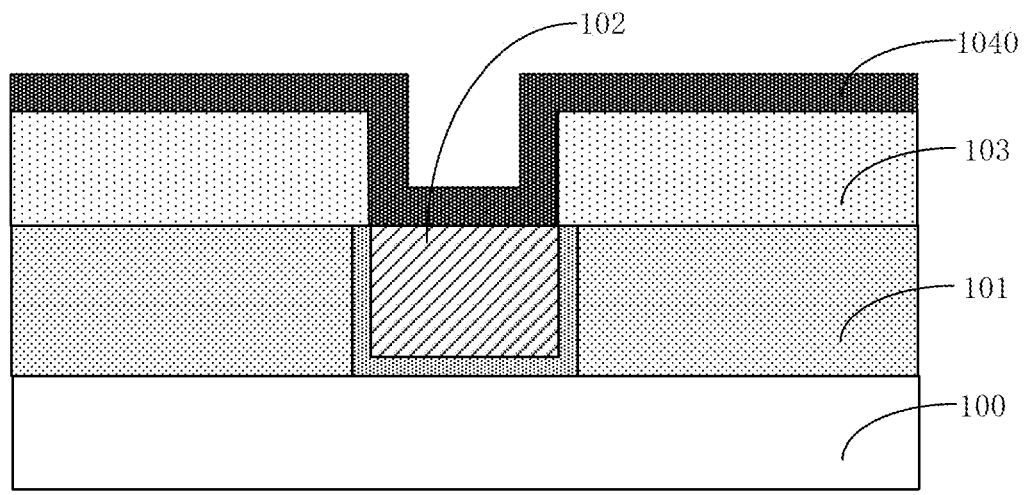
Figure 1D:
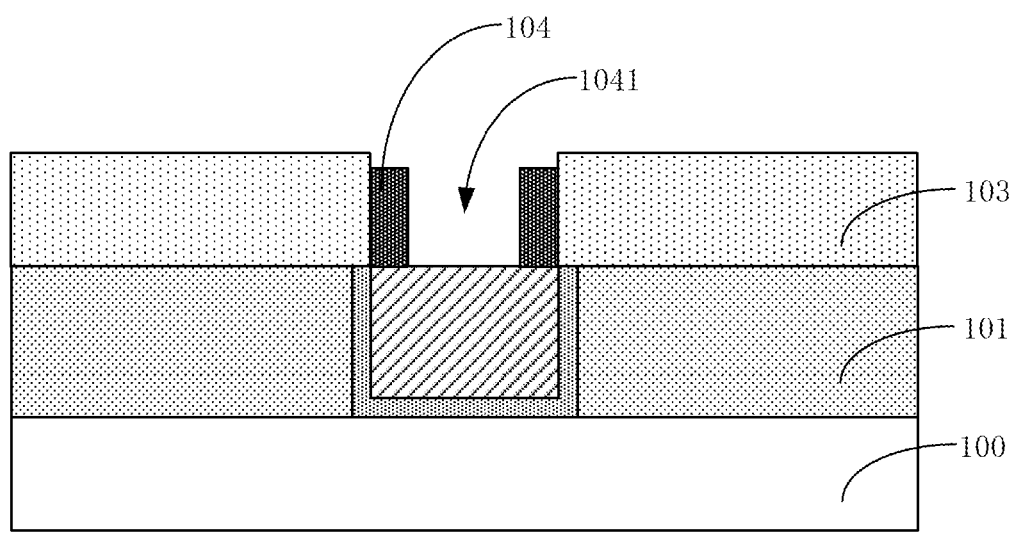

Referring to FIG. 3, FIG. 1C, and FIG. 1D, the step S103 may include the following sub-steps: providing a phase change material layer 1040 that may cover and contact the first electrode 102; and removing (e.g., using a sputtering process such as an argon sputtering process), a portion of the phase change material layer 1040 positioned inside the hole 1031 to form a phase change member 104 that may expose a first portion of the first electrode 102 (e.g., the center portion of the top side of the first electrode 102 illustrated in FIG. 1D) and may directly contact a second portion of the first electrode 102 (e.g., the two edge portions of the top side of the first electrode 102 illustrated in FIG. 1D).

The sputtering process may represent an etch-back process performed on the phase change material layer 1040. In the argon sputtering process, high-energy argon ions may bombard a selected portion of the phase change material layer 1040, such that the selected portion of the phase change material layer 1040 may be removed.

The method may include removing a portion of the phase change material layer 1040 covering the second insulating layer 103 when removing the portion of the phase change material layer 1040 positioned inside the hole 1031. A portion of the phase change material layer 1040 that attaches to an inner sidewall of the hole 1031 may remain unremoved and may form the phase change member 104.

The sputtering process may prevent use of an additional mask, such that the process for forming the phase change member 104 may be advantageously simplified. The sputtering process may also advantageously prevent or substantially minimize potential damage to the sidewall of the hole 1031. The sputtering process may also be substantially compatible with various possible processes used for forming other structures of the semiconductor device, such as a complementary metal-oxide-semiconductor (CMOS) process used for forming the hole 1031.

In an embodiment, a photolithography process may be used for forming the phase change member 104.

The phase change member 104 may be formed of one or more known phase change materials, such as Ge2Sb2Te5.

The phase change member 104 may have a hollow structure (and/or hallow shape). For example, the phase change member 104 may have a hollow 1041 (or through-hole 1041) that may extend from the first electrode 102 to a top side of the phase change member 104.

The phase change member 104 may be ring-shaped in a top view of the phase change member 104. The first portion of the first electrode 102 may be surrounded by the second portion of the first electrode 102.

A thickness of the phase change member 104 in a direction parallel to the substrate 100 may be in a range of 10 nm to 30 nm. The thickness of the ring-shaped phase change member 104 may be a difference between an outer radius of the phase change member 104 and an inner radius of the phase change member 104.

An outer diameter of the phase change member 104 may be in a range of 30 nm to 100 nm. An inner diameter of the phase change member 104 may be in a range of 20 nm to 90 nm.

According to embodiments of the invention, the hollow structure of the phase change member 104 may minimize the contact area between the phase change member 104 and at least the first electrode 102, while specifications and limitations related to the associated substrate 100 (e.g., a FEOL member) and the associated manufacturing equipment may also be satisfied. Therefore, the drive current for the semiconductor device (and a related electronic device) may be minimized. Advantageously, power consumption of the semiconductor device (and the related electronic device) may be minimized. The sputtering process used for forming the phase change member 104 may also provide advantages related to process compatibility.

Figure 1E:
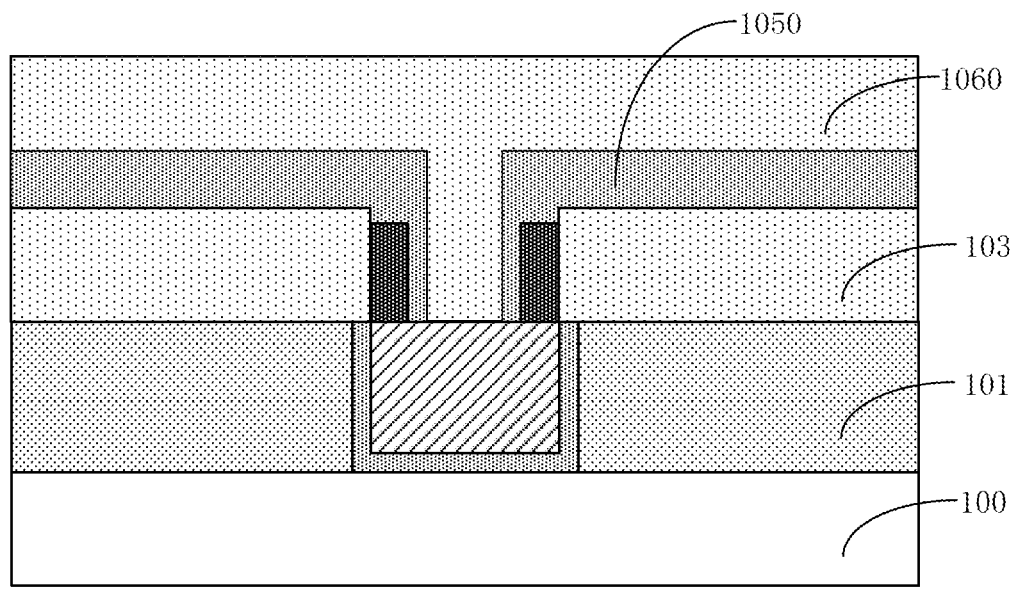
Figure 1F:
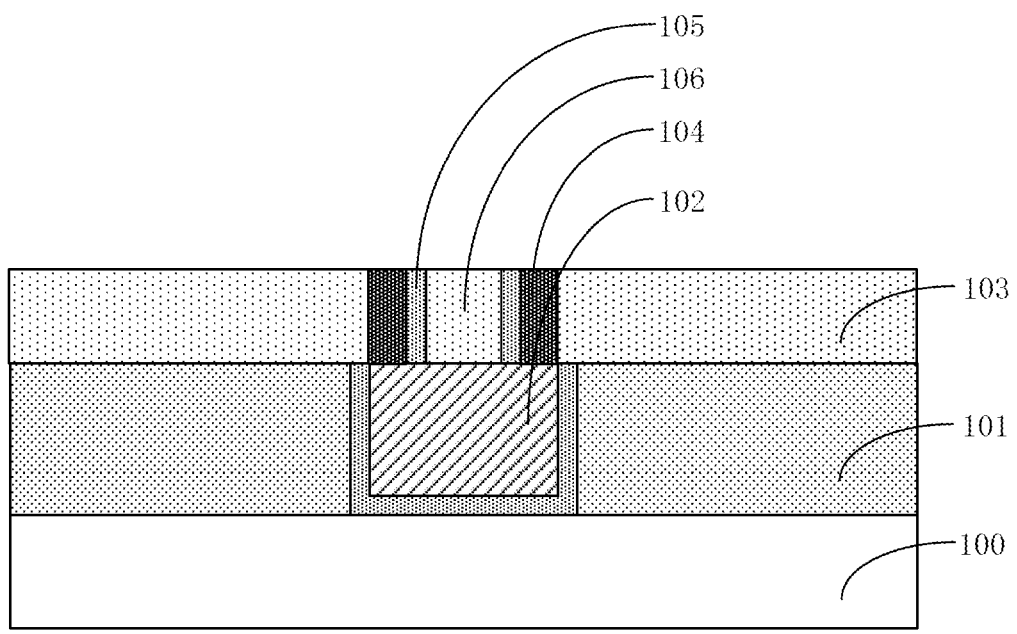

Referring to FIG. 1E and FIG. 1F, the method may include the following steps: providing a first dielectric material 1050 at least in the hole 1031 and/or in the hollow 1041; using the first dielectric material 1050 to form a first dielectric member 105; providing a second dielectric material 1060 at least in the hole 1031 and/or in the hollow 1041; and using the second dielectric material 1060 to form a second dielectric member 106.

The first dielectric material 1050 may be a thermal insulation material. The first dielectric material 1050 may be or include, for example, silicon nitride and/or one or more other suitable materials. The first dielectric material 1050 may be provided using one or more of a deposition process, a high aspect ratio process, etc.

The second dielectric material 1060 may be different from the first dielectric material 1050. The second dielectric material 1060 may be or include, for example, silicon oxide and/or one or more other suitable materials. The second dielectric material 1060 may be provided using one or more of a deposition process, a high aspect ratio process, etc.

One or more polishing processes, e.g., one or more CMP processes, may be performed to remove one or more of an excess portion of the second dielectric material 1060, an excess portion of the first dielectric material 1050, and an excess portion of the second insulating layer 103 that extend beyond the phase change member 104.

A first polishing process, e.g., a first CMP process, may be performed to remove a portion of the second dielectric material 1060 that is positioned outside the hole 1031 and/or overlaps the second insulating layer 103, the first dielectric material 1050, and/or the phase change member 104 in a direction perpendicular to the substrate 100, for forming the second dielectric member 106. The first polishing process and/or a second polishing process may be performed to remove a portion of the first dielectric material 1050 that is positioned outside the hole 1031 and/or overlaps the second insulating layer 103 and/or the phase change member 104 in a direction perpendicular to the substrate 100, for forming the first dielectric member 105. The first polishing process, the second polishing process, and/or a third polishing process may be performed to remove a portion of the second insulating layer 103 that is higher than the phase change member 104, for optimizing the thickness of the second insulating layer 103.

As a result, the top surfaces of the second insulating layer 103, the phase change member 104, the first dielectric member 105, and the second dielectric member 106 may be substantially positioned in a same horizontal plane.

FIG. 1F may be a cross-sectional view taken along the line A-A' indicated in FIG. 2. Referring to FIG. 1F and FIG. 2, the first dielectric member 105 may be positioned between two portions of the phase change member 104 and/or may be surrounded by the phase change member 104. The second dielectric member 106 may be positioned between two portions of the first dielectric member 105 and/or may be surrounded by the first dielectric member 105.

In an embodiment, only one dielectric member (formed of one dielectric material such as silicon oxide) may be formed inside the hollow 1041 of the phase change member 104.

Figure 1G:
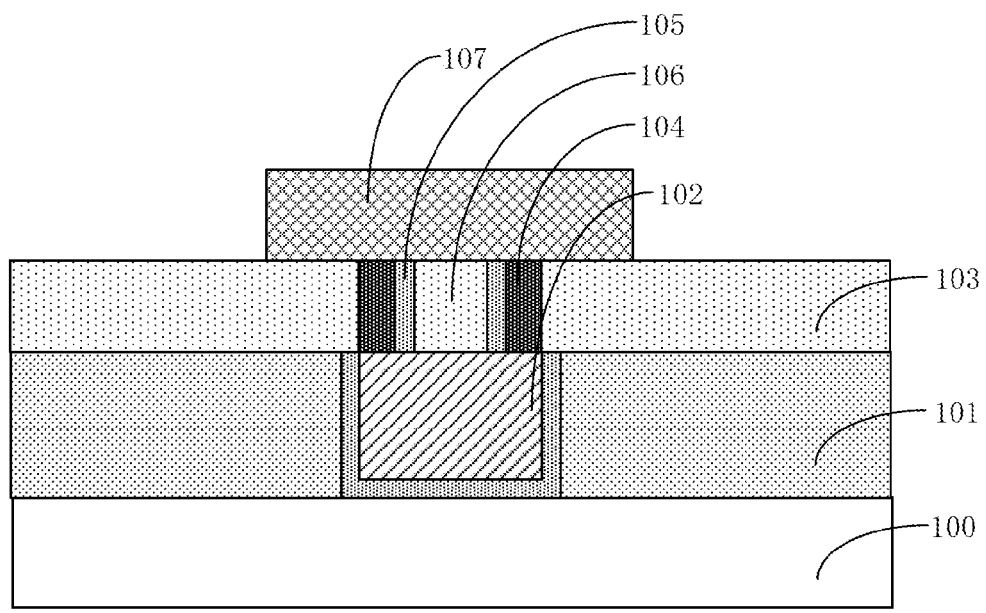

Referring to FIG. 1G, the method may include forming a second electrode 107 on the phase change member 104. The second electrode 107 may be formed of a conductive material, e.g., a metal material. The second electrode 107 may directly contact the phase change material and may directly contact one or more of the first dielectric member 105, the second dielectric member 106, and the second insulating layer 103. Each of the phase change material, the first dielectric member 105, and the second dielectric member 106 may be positioned between the first electrode 102 and the second electrode 107.

According to embodiments of the invention, the hollow structure of the phase change member 104 may minimize the contact area between the phase change member 104 and each of the first electrode 102 and the second electrode 107, while specifications and limitations related to the associated substrate 100 (e.g., a FEOL member) and the associated manufacturing equipment may also be satisfied. Advantageously, power consumption of the semiconductor device (and the related electronic device) may be minimized. The sputtering process used for forming the phase change member 104 may also provide advantages related to process compatibility.

A semiconductor device manufactured according to one or more embodiments of the invention may be, for example, a phase change memory or a device that includes a phase change memory.

Figure 4:
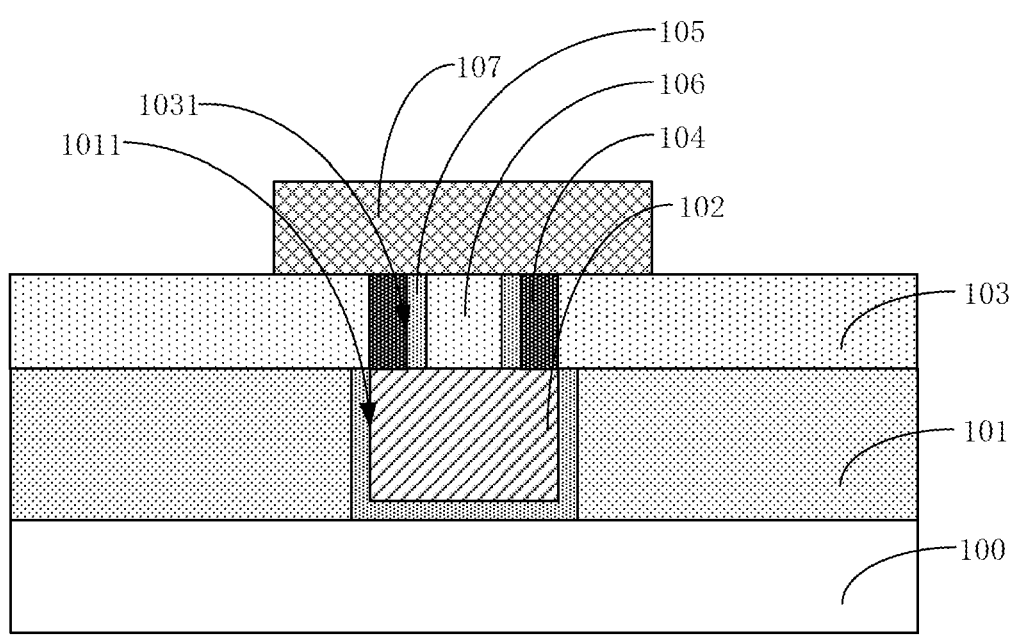
FIG. 4 shows a schematic cross-sectional view that illustrates elements and structures of a semiconductor device in accordance with one or more embodiments of the present invention.

FIG. 4 shows a schematic cross-sectional view that illustrates elements and structures of a semiconductor device in accordance with one or more embodiments of the present invention. The semiconductor device may include one or more of the features discussed above with reference to FIGS. 1A to 1G, 2, and 3. The semiconductor device may include the following elements: a first electrode 102; and a phase change member 104 formed of a phase change material and partially overlapping the first electrode 102. A first portion of a side of the first electrode 102 (e.g., the left portion of the top side of the first electrode 102 illustrated in FIG. 4) may directly contact a first portion of the phase change member 104 (e.g., the left portion of the phase change member 104 illustrated in FIG. 4). A second portion of the side of the first electrode 102 (e.g., the right portion of the top side of the first electrode 102 illustrated in FIG. 4) may directly contact a second portion of the phase change member 104 (e.g., the right portion of the phase change member 104 illustrated in FIG. 4). A third portion of the side of the first electrode 102 (e.g., the center portion of the top side of the first electrode 102 illustrated in FIG. 4) may be positioned between the first portion of the side of the first electrode 102 and the second portion of the side of the first electrode 102 and may not directly contact the phase change member 104.

The phase change member 104 may have a hollow structure (and/or hollow shape), e.g., may have a hollow 1041 (illustrated in FIG. 1D).

The phase change member 104 may be ring-shaped in a top view of the phase change member 104. The third portion of the side of the first electrode 102 may be surrounded by the phase change member 104 in a top view that shows the phase change member 104 and the third portion of the side of the first electrode 102.

The semiconductor device may include a substrate 100, which may be a FEOL member that may one or more of a semiconductor substrate 100, a metal layer, an electronic component, an interconnect structure, etc. The first electrode 102 may be positioned between the substrate 100 and the phase change member 104.

A thickness of each of the first portion of the phase change member 104 and the second portion of the phase change member 104 may be in a range of 10 nm to 30 nm.

A width (e.g., an outer diameter) of the phase change member 104 in a direction parallel to the substrate 100 may be in a range of 30 nm to 100 nm. A distance between the first portion of the phase change member 104 and the second portion of the phase change member 104 (e.g., an inner diameter) may be in a range of 20 nm to 90 nm.

The semiconductor device may include a first dielectric member 105, which may be formed of a first dielectric material 1050 (e.g., silicon nitride). The first dielectric member 105 may directly contact the third portion of the side of the first electrode 102. The first dielectric member 105 may be positioned between the first portion of the phase change member 104 and the second portion of the phase change member 104. The first dielectric member 105 may be surrounded by the phase change member 104.

The semiconductor device may include a second dielectric member 106, which may be formed of a second dielectric material 1060 (e.g., silicon oxide) different from the first dielectric material 1050. The second dielectric member 106 may directly contact the third portion of the side of the first electrode 102. The second dielectric member 106 may be positioned between two portions of the first dielectric member 105 and/or may be surrounded by the first dielectric member 105.

The semiconductor device may include a second electrode 107. At least one of the first dielectric member 105 and the second dielectric member 106 may be positioned between the first electrode 102 and the second electrode 107.

The semiconductor device may have one or more of the advantages discussed above with reference to FIGS. 1A to 1G, FIG. 2, and FIG. 3. For example, power consumption of the semiconductor device may be satisfactorily low.

An embodiment of the invention may be related to an electronic device. The electronic device may include a semiconductor device that may have one or more features and advantages analogous to or identical to one or more features and advantages discussed above with reference to one or more of FIGS. 1A to 1G, FIG. 2, FIG. 3, and FIG. 4.

The electronic device may be or may include one or more of a mobile phone, a tablet computer, a notebook computer, a netbook, a game console, a television, a video compact disc (VCD) player, a digital video disc (DVD) player, a navigation device, a camera, a camcorder, a voice recorder, an MP3 player, an MP4 player, a portable game device, etc.

The electronic device may be or may include an intermediate product (e.g., a mobile phone main board) or module including a semiconductor device that may have one or more of the features and advantages discussed above.

According to embodiments of the invention, a semiconductor device may be manufactured to include a hollow phase change member, such that the contact area between the phase change member and one or more corresponding electrodes may be minimized, while specifications and limitations related to the associated front-end-of-line member and the associated manufacturing equipment may also be satisfied. Therefore, the drive current for the semiconductor device (and a related electronic device) may be minimized. Advantageously, power consumption of the semiconductor device (and the related electronic device) may be minimized. The sputtering process used for forming the phase change member may also provide advantages related to process compatibility.

While this invention has been described in terms of several embodiments, there are alterations, permutations, and equivalents, which fall within the scope of this invention. It should also be noted that there are many alternative ways of implementing the methods and apparatuses of the present invention. Furthermore, embodiments of the present invention may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents as fall within the true spirit and scope of the present invention.

What is claimed is:

1. A method for manufacturing a semiconductor device, the method comprising:

preparing a substrate;
preparing a first insulating layer on the substrate;
preparing a first electrode in the first insulating layer adhered to the substrate through an adhesive layer, wherein the adhesive layer is positioned between the first electrode and the first insulating layer, and between the first electrode and the substrate;
preparing a second insulating layer on the first insulating layer;
removing a portion of the second insulating layer to form a hole that at least partially exposes the first electrode;
providing a phase change material layer that covers the first electrode;
removing a portion of the phase change material layer positioned in the hole to form a phase change member that exposes a first portion of the first electrode and contacts a second portion of the first electrode, wherein the first electrode is positioned between the substrate and the phase change member, and the first electrode and the adhesive layer as a whole directly contacts the substrate and the phase change member, and has a constant width between the substrate and the phase change member;
providing a first dielectric member in the hole, wherein the first dielectric member is formed of a first dielectric material, contacting the first electrode, and surrounded by the phase change member; and
providing a second dielectric member in the hole, wherein the second dielectric member is formed of a second dielectric material different from the first dielectric material, contacting the first electrode and surrounded by the first dielectric member.

2. The method of claim 1, wherein a sputtering process is performed to remove the portion of the phase change material layer.

3. The method of claim 1, wherein an argon sputtering process is performed to remove the portion of the phase change material layer.

4. The method of claim 1, wherein the phase change member has a hollow structure.

5. The method of claim 1, wherein the phase change member is ring-shaped in a top view of the phase change member.

6. The method of claim 1, further comprising: removing a portion of the phase change material layer covering the second insulating layer when removing the portion of the phase change material layer positioned in the hole.

7. The method of claim 1, wherein a thickness of the phase change member in a direction parallel to the substrate is in a range of 10 nm to 30 nm.

8. The method of claim 1, wherein an outer diameter of the phase change member is in a range of 30 nm to 100 nm, and wherein an inner diameter of the phase change member is in a range of 20 nm to 90 nm.

* * * * *